(12) United States Patent
Boday et al.

(10) Patent No.: US 9,623,605 B2
(45) Date of Patent: Apr. 18, 2017

(54) THERMALLY CROSS-LINKABLE PHOTO-HYDROLYZABLE INKJET PRINTABLE POLYMERS FOR MICROFLUIDIC CHANNELS

(75) Inventors: Dylan J. Boday, Tucson, AZ (US); Joseph Kuczynski, Rochester, MN (US); Robert E. Meyer, III, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 512 days.

(21) Appl. No.: 13/611,135

(22) Filed: Sep. 12, 2012

(65) Prior Publication Data

US 2014/0072777 A1    Mar. 13, 2014

(51) Int. Cl.
*C08L 39/00* (2006.01)
*B29C 67/00* (2017.01)
(Continued)

(52) U.S. Cl.
CPC ........ *B29C 67/0059* (2013.01); *C09D 11/106* (2013.01); *C09D 11/30* (2013.01); *Y10T 428/24802* (2015.01)

(58) Field of Classification Search
CPC .. B05D 3/06; B05C 11/00; B05C 5/02; B32B 33/00; C09D 11/00; C09D 11/106; C09D 11/30; B29C 67/0059; Y10T 428/24802
(Continued)

(56) References Cited

U.S. PATENT DOCUMENTS 4,486,489 A    12/1984 George
5,229,244 A *  7/1993 Hertler ............... G03F 7/28
                                            430/144
(Continued)

OTHER PUBLICATIONS

Lee et al., "Multiphoton Writing of Three-Dimensional Fluidic Channels within a Porous Matrix", Journal of the American Chemical Society, vol. 131, No. 32, 2009, pp. 11294-11295, published on Web Jul. 28, 2009.
(Continued)

*Primary Examiner* — Robert S Walters, Jr.
(74) *Attorney, Agent, or Firm* — Matthew J. Bussan (57) ABSTRACT

Thermally cross-linkable photo-hydrolyzable inkjet printable polymers are used to print microfluidic channels layer-by-layer on a substrate. In one embodiment, for each layer, an inkjet head deposits droplets of a mixture of hydrophobic polymer and cross-linking agent in a pattern lying outside a two-dimensional layout of the channels, and another inkjet head deposits droplets of a mixture of poly(tetrahydropyranyl methacrylate) PTHPMA (or another hydrophobic polymer which hydrolyzes to form a hydrophilic material), cross-linking agent, and a photoacid generator (PAG) in a pattern lying inside the two-dimensional layout of the channels. After all layers are printed, flood exposure of the entire substrate to UV radiation releases acid from the PAG which hydrolyzes PTHPMA to form hydrophilic poly(methacrylic acid) PMAA, thereby rendering the PTHPMA regions hydrophilic. The layers of these now-hydrophilic patterned regions together define the microfluidic channels. The cross-
(Continued)

linking agent (e.g., triallyl isocyanurate TAIC) forms covalent cross-links between the two polymer phases.

8 Claims, 4 Drawing Sheets (51) Int. Cl.
C09D 11/106 (2014.01)
C09D 11/30 (2014.01)

(58) Field of Classification Search
USPC .......................................... 427/511; 524/516
See application file for complete search history.

(56) References Cited

U.S. PATENT DOCUMENTS

| 6,861,205 B2 | 3/2005 | Bowman et al. |
| 7,431,888 B2 | 10/2008 | Frechet et al. |
| 2002/0015902 A1 | 2/2002 | Yau et al. |
| 2002/0108860 A1 | 8/2002 | Staats |
| 2004/0239705 A1 | 12/2004 | Arikita |
| 2006/0023035 A1 | 2/2006 | Sugahara |
| 2007/0097314 A1* | 5/2007 | Wimberger-Friedl et al. .......................... 351/159 |
| 2009/0029623 A1 | 1/2009 | Son et al. |
| 2011/0122406 A1 | 5/2011 | Khine et al. |
| 2012/0009662 A1 | 1/2012 | Shen et al. |

OTHER PUBLICATIONS

Ozawa et al., "Development of a Femtoliter Piezo Ink-jet Head for high resolution printing", Society for Imaging Science and Technology, NIP23 and Digital Fabrication 2007, Final Program and Proceedings, pp. 898-901.
Watanabe, "Refreshable microfluidic channels constructed using an inkjet printer", Sensors and Actuators B, 122, 2007, pp. 141-147.
Abe et al., "Inkjet-Printed Microfluidic Multianalyte Chemical Sensing Paper", Analytical Chemistry, vol. 80, No. 18, 2008, pp. 6928-6934, published on Web Aug. 13, 2008.
Wikipedia contributors, "Z Corporation", Wikipedia, The Free Encyclopedia, http://en.wikipedia.org/w/index.php?title=Z_Corporation&oldid=385377389 (accessed Oct. 11, 2010).
Wikipedia contributors, "3D printing", Wikipedia, The Free Encyclopedia, http://en.wikipedia.org/w/index.php?title=3D_printing&oldid=387667341 (accessed Oct. 11, 2010).
Wikipedia contributors, "Inkjet printer", Wikipedia, The Free Encyclopedia, http://en.wikipedia.org/w/index.php?title=Inkjet_printer&oldid=389038898 (accessed Oct. 11, 2010).
U.S. Appl. No. 12/913,214, to Boday et al., entitled "Inkjet Printing of Microfluidic Channels", filed Oct. 27, 2010, assigned to International Business Machines Corporation.

* cited by examiner

FIG. 4

THERMALLY CROSS-LINKABLE PHOTO-HYDROLYZABLE INKJET PRINTABLE POLYMERS FOR MICROFLUIDIC CHANNELS

BACKGROUND OF THE INVENTION

1. Field of Invention

The present invention relates in general to the field of microfluidics. More particularly, the present invention relates to using thermally cross-linkable photo-hydrolyzable inkjet printable polymers and inkjet printing to fabricate one or more microfluidic channels layer-by-layer in a substrate body.

2. Background Art

The field of microfluidics emerged in the 1980s and has enabled the development of many microscale technologies, including DNA chips, lab-on-a-chip devices, and precision inkjet printing. Microfluidics provides the ability to deliver nanoliter and picoliter volumes of liquids by direct application, such as inkjet printing, or via continuous flow through microfluidic channels. Unfortunately, the current process for the creation of three-dimensional microfluidic channels, i.e., the 2-photon writing process, is expensive and extremely complex.

The current 2-photon writing process involves the application of an acid-hydrolyzable polymer brush, poly(tetrahydropyranyl methacrylate) (PTHPMA), onto a glass surface. Interstitial spaces are filled in via spin coating with a mixture of a photoacid generator (PAG), a sensitizer, and a copolymer of methyl methacrylate and poly(ethylene glycol) methylether methacrylate. Once the mixture has been spin coated onto the glass surface, a pulsed laser source (e.g., a Ti-sapphire femtosecond laser) is used to effectively carve out a channel of acid in the PTHPMA. The pulsed laser source is precisely focused and rastered through the PTHPMA in a pattern that defines the channel. This results in localized 2-photon generation of acid (i.e., the PAG is exposed within localized regions of the PTHPMA and releases acid only within those regions) in the PTHPMA. A 2-photon writing process is required to maintain the necessary spatial resolution (otherwise, the PAG would be exposed throughout the entire thickness of the PTHPMA and release acid everywhere). The photoacid hydrolyzes the PTHPMA during heating, forming hydrophilic poly(methacrylic acid) (PMAA) in the form of a three-dimensional hydrophilic channel traveling through a hydrophobic substrate. The 2-photon writing process requires precise calibration and alignment of one or more femtosecond lasers, which is costly and difficult to execute. An example of a 2-photon writing process is disclosed in Lee et al., "Multiphoton Writing of Three-Dimensional Fluidic Channels within a Porous Matrix", Journal of the American Chemical Society, Vol. 131, No. 32, 2009, pages 11294-11295, published on Web Jul. 28, 2009, which is hereby incorporated herein by reference in its entirety.

Therefore, a need exists for an enhanced mechanism for fabricating one or more microfluidic channels in a substrate body.

SUMMARY OF THE INVENTION

According to some embodiments of the present invention, inkjet printing and thermally cross-linkable photo-hydrolyzable inkjet printable polymers are used to print microfluidic channels layer-by-layer on a substrate. In one embodiment, for each layer, an inkjet head deposits droplets of a mixture of a hydrophobic polymer and a cross-linking agent in a pattern lying outside a two-dimensional layout of the channels, and another inkjet head deposits droplets of a mixture of poly(tetrahydropyranyl methacrylate) PTHPMA (or another hydrophobic polymer which hydrolyzes to form a hydrophilic material), a cross-linking agent, and a photoacid generator (PAG) in a pattern lying inside the two-dimensional layout of the channels. After all layers are printed, flood exposure of the entire substrate to UV radiation releases acid from the PAG which hydrolyzes PTHPMA to form hydrophilic poly(methacrylic acid) PMAA, thereby rendering the PTHPMA regions hydrophilic. The layers of these now-hydrophilic patterned regions together define the microfluidic channels. The cross-linking agent (e.g., triallyl isocyanurate TAIC) forms covalent cross-links between the polymer matrix and the discrete channels printed to form the microfluidic channels. By crosslinking these two polymer phases, phase separation is avoided and well defined microfluidic channels are maintained.

BRIEF DESCRIPTION OF THE DRAWINGS

The preferred exemplary embodiments of the present invention will hereinafter be described in conjunction with the appended drawings, where like designations denote like elements.

FIG. 3 also includes a sectional diagram illustrating a cross-section of one of the microfluidic channels fabricated layer-by-layer in the substrate body using a thermally cross-linkable photo-hydrolyzable inkjet printable polymer in accordance with some embodiments of the present invention.

DETAILED DESCRIPTION OF THE PREFERRED EMBODIMENTS

1. Overview

In accordance with some embodiments of the present invention, inkjet printing and thermally cross-linkable photo-hydrolyzable inkjet printable polymers are used to print microfluidic channels layer-by-layer on a substrate. In one embodiment, for each layer, an inkjet head deposits droplets of a mixture of a hydrophobic polymer and a cross-linking agent in a pattern lying outside a two-dimensional layout of the channels, and another inkjet head deposits droplets of a mixture of poly(tetrahydropyranyl methacrylate) PTHPMA (or another hydrophobic polymer which hydrolyzes to form a hydrophilic material), a crosslinking agent, and a photoacid generator (PAG) in a pattern lying inside the two-dimensional layout of the channels. After all layers are printed, flood exposure of the entire substrate to UV radiation releases acid from the PAG which hydrolyzes PTHPMA to form hydrophilic poly(methacrylic acid) PMAA, thereby rendering the PTHPMA regions hydrophilic. The layers of these now-hydrophilic patterned regions together define the microfluidic channels. The cross-linking agent (e.g., triallyl isocyanurate TAIC) forms covalent cross-links between the polymer matrix and the discrete channels printed to form the microfluidic channels. By crosslinking these two polymer phases, phase separation is avoided and well defined microfluidic channels are maintained.

2. Detailed Description

Figure 1:
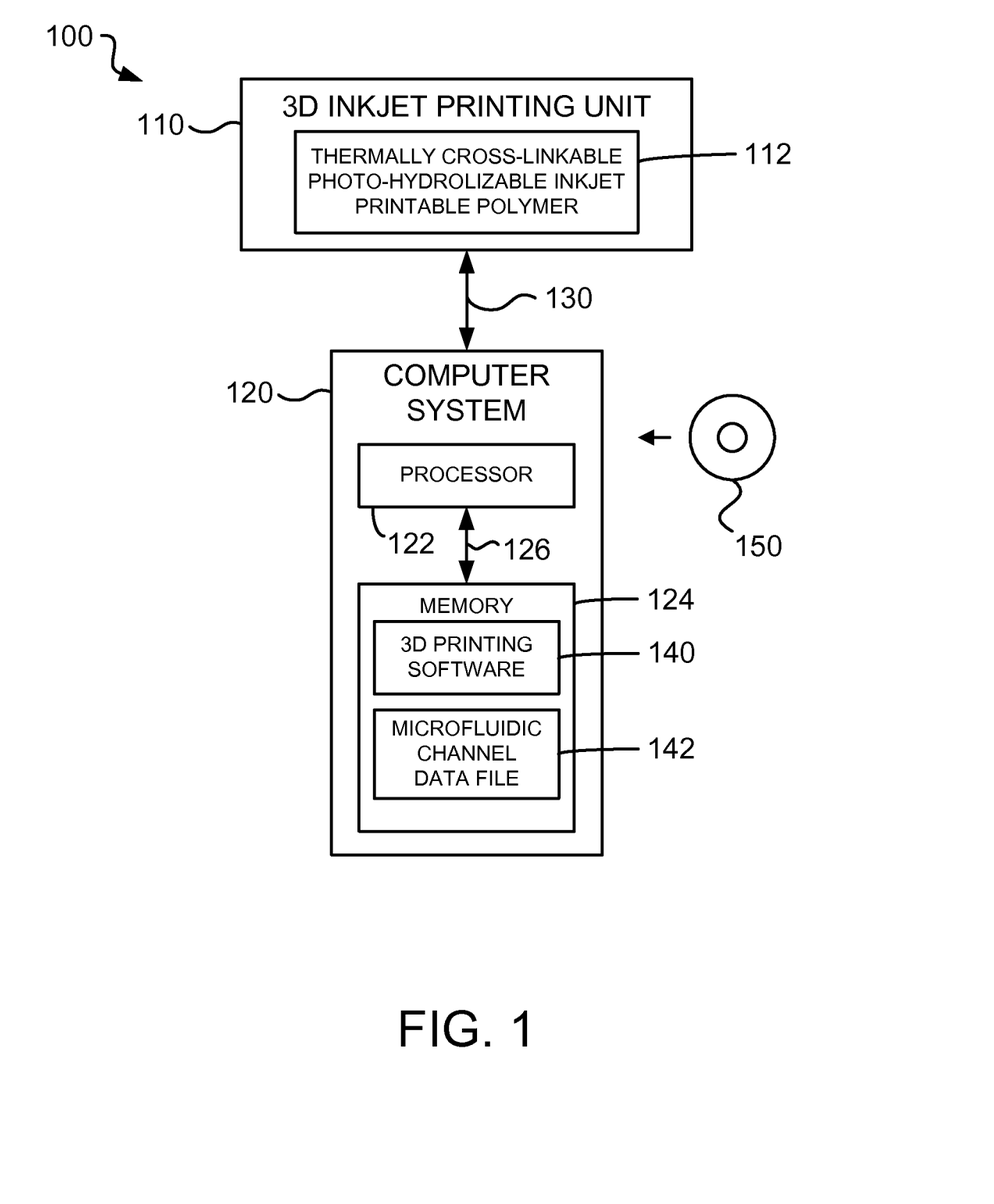
FIG. 1 is a block diagram illustrating an apparatus for fabricating one or more microfluidic channels in a substrate body using a thermally cross-linkable photo-hydrolyzable inkjet printable polymer in accordance with some embodiments of the present invention.

FIG. 1 is a block diagram illustrating an apparatus 100 for fabricating one or more microfluidic channels in a substrate body in accordance with some embodiments of the present invention. The microfluidic channel fabricating apparatus 100 includes a three-dimensional inkjet printing unit 110 and a data processing unit, such as a computer system 120. Preferably, as illustrated in FIG. 1, the three-dimensional (3D) inkjet printing unit 110 and the data processing unit are provided as separate entities. However, those skilled in the art will appreciate that the data processing unit and the 3D inkjet printing unit may be integrated into a single entity.

The 3D inkjet printing unit 110, an example of which is described in more detail below with reference to FIG. 2, typically includes an enclosure (e.g., 201 shown in FIG. 2) having an access or opening (not shown), as well as a print bed (e.g., 202 shown in FIG. 2) accessible through the opening. A substrate, such as a silica substrate (e.g., 204 shown in FIG. 2), rests on the print bed. While the present invention will be discussed in terms of fabricating one or more microfluidic channels on a silica substrate, it should be understood that this invention can be used to fabricate one or more microfluidic channels on a variety of substrates, including semiconductor wafers, microelectronic chips, glass, metal, polymer, plastic, paper, etc.

The 3D inkjet printing unit 110 also includes one or more thermally cross-linkable photo-hydrolyzable inkjet printable polymers 112 (e.g., a mixture of PTHPMA (or another hydrophobic polymer which hydrolyzes to form a hydrophilic material), a cross-linking agent, and a photoacid generator, as described below) that is used to print one or more microfluidic channels layer-by-layer on the substrate.

The 3D inkjet printing unit 110 may be a modified version of a conventional 3D inkjet printer. Typically, conventional 3D inkjet printers are used for rapid prototyping. An object to be prototyped is built layer-by-layer in a conventional 3D inkjet printer from many thin cross-sections of a 3D model of the object. An example of a suitable conventional 3D inkjet printer is the ZPrinter, available from Z Corporation, Burlington, Mass. Software is used to slice a 3D model (typically, a 3D CAD model) of the object to be prototyped into thin cross-sections that are fed into the conventional 3D inkjet printer. An inkjet printing head in the conventional 3D inkjet printer moves across a bed of powder (typically, plaster or resins) and selectively deposits a liquid binding material in the shape of a first of the thin cross-sections. Another layer of powder is then spread across the previous layer of bound and unbound powder, and the process is repeated one layer at a time until every layer is printed.

In accordance with an embodiment of the present invention, the 3D inkjet printing unit 110 is provided by modifying existing hardware, i.e., the inkjet printing heads in a conventional 3D inkjet printer may be modified to deposit a stream of droplets each having a suitable volume (e.g., approximately 500-2000 femtoliters, as described below) and of a suitable material, such as the thermally cross-linkable photo-hydrolyzable inkjet printable polymer 112, on a suitable substrate (e.g., a silicate, as described below) in lieu of depositing the liquid binding material on the powder. In accordance with another embodiment of the present invention, instead of modifying existing hardware, the 3D inkjet printing unit 110 may be provided as a new apparatus.

The computer system 120 is largely conventional except that it includes a modified version of conventional 3D printing software 140 that (preferably, using a microfluidic channel data file 142) performs the functions as further described below with reference to FIG. 4. For example, the computer system 120 may be a PC. However, those skilled in the art will appreciate that some aspects of the present invention may apply equally to any computer system, regardless of whether the computer system is a complicated multi-user computing apparatus, a PC, or an embedded control system. As shown in FIG. 1, the computer system 120 comprises one or more processors 122 and a main memory 124. These system components, as well as other conventional system components such as a hard disk drive, CD-ROM drive, and a network interface (not shown), are interconnected through a system bus 126.

A data bus 130 couples the 3D inkjet printing unit 110 to the computer system 120. Preferably, the 3D inkjet printing unit 110 and the computer system 120 can provide digital data to each other on the bus 130, through an existing digital I/O port such as an RS-232C serial port or USB port of the computer system 120. Appropriate control busses may also connect the computer system 120 to the 3D inkjet printing unit 110 in a manner well known in the art.

Figure 2:
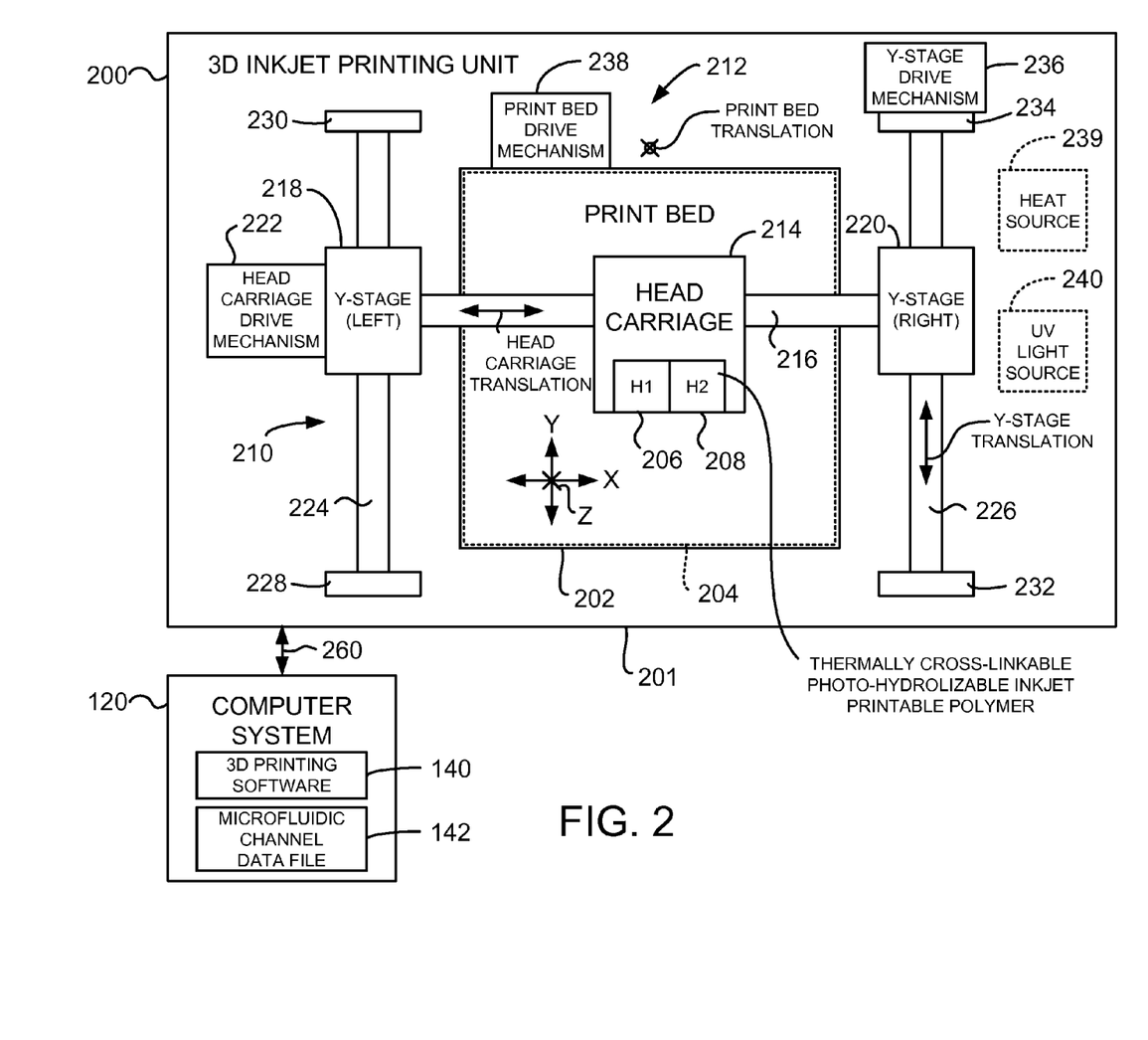
FIG. 2 is a block diagram illustrating an exemplary three-dimensional inkjet printing unit suitable for use in the apparatus of FIG. 1.

Any such connections (e.g., a data bus, control busses, etc.) between the 3D inkjet printing unit 110 and the computer system 120 are more generally referred to herein as a "network connection" (e.g., 260 shown in FIG. 2).

In the embodiment illustrated in FIG. 1, the 3D printing software 140 and the microfluidic channel data file 142 reside in the main memory 124. In accordance with some embodiments of the present invention, the 3D printing software 140 (preferably, using the microfluidic channel data file 142) performs the functions as further described below with reference to FIG. 4.

The 3D printing software 140 may be, for example, a modified version of conventional 3D printing software. An example of suitable conventional 3D printing software is ZPrint software, available from Z Corporation, Burlington, Mass. ZPrint software is a tool for preparing CAD files for optimal printing on Z Corporation 3D Printers. Any such suitable conventional 3D printing software may be modified to perform the functions as further described below with reference to FIG. 4. In this case, the so-modified 3D printing software can be sold as an integral part of a new apparatus or as a software upgrade to work with existing hardware.

The microfluidic channel data file 142 preferably is a three-dimensional model of the one or more microfluidic channels (e.g., 310 shown in FIG. 3) and/or surrounding structure. For example, the microfluidic channel data file 142 may be a 3D CAD file. Preferably, the 3D printing software 140 imports the microfluidic channel data file 142 and slices the three-dimensional model of the one or more microfluidic channels and/or surrounding structure into thin cross-sectional slices. These cross-sectional slices are sent from the computer system 120 to the 3D inkjet printing unit 110 over the data bus 130.

At this point, it is important to note that while the description above is in the context of a fully functional computer system, those skilled in the art will appreciate that the 3D printing software 140, as well as other software entities described herein (e.g., the microfluidic channel data file 142) may be distributed as an article of manufacture (also referred to herein as a "computer program product") in a variety of forms, and the claims extend to all suitable types of computer-readable media used to actually carry out the distribution, including recordable type media such as floppy disks, CD-RWs, CD-ROMs (e.g., CD-ROM 150 in FIG. 1) and DVD-ROMs.

FIG. 2 is a block diagram illustrating an exemplary 3D inkjet printing unit 200 suitable for use as the 3D inkjet printing unit 110 of FIG. 1. Those skilled in the art will appreciate, however, that the particular 3D inkjet printing unit 200 illustrated in FIG. 2 is exemplary and that a 3D inkjet printing unit used in accordance with some embodiments of the present invention may take many other forms. For example, a 3D inkjet printing unit used in accordance with some embodiments of the present invention may include an alternative x-y plane drive mechanism and/or an alternative z-axis drive mechanism in lieu of those mechanisms illustrated in FIG. 2.

The 3D inkjet printing unit 200 includes an enclosure 201, a print bed 202 (on which rests a substrate 204), at least two inkjet print heads (e.g., a first inkjet head 206 and a second inkjet head 208), an x-y plane drive mechanism 210, and a z-axis drive mechanism 212. The x-y plane drive mechanism 210 produces relative movement between the inkjet heads 206, 208 and the substrate 204 in an x-y plane of the substrate, i.e., parallel to the surface of the print bed 202. The z-axis drive mechanism 212 produces relative motion between the inkjet heads 206, 208 and the substrate 204 in a z-direction of the substrate, i.e., perpendicular to the surface of the print bed 202.

The x-y plane drive mechanism 210, which is conventional, includes a head carriage 214, a head carriage guide rail 216, a pair of y-stage blocks 218, 220, a head carriage drive mechanism 222, a pair of y-stage guide rails 224, 226, two pair of y-stage guide rail mounts 228, 230, 232, 234, and a y-stage drive mechanism 236. The inkjet heads 206, 208 are mounted on the head carriage 214, which is moved on the head carriage guide rail 216 between the y-stage block (left) 218 and the y-stage block (right) 220 by the head carriage drive mechanism 222. Typically, the head carriage drive mechanism 222 drives the head carriage 214 in the x-direction with sufficient precision using a servo controlled stepper motor/belt arrangement (not shown). One skilled in the art will appreciate, however, that any suitable conventional drive mechanism may be used, such as a servo controlled stepper motor/lead screw arrangement.

The y-stage blocks 218, 220 are moved on the y-stage guide rails 224, 226 between y-stage guide rail mounts (upper) 230, 234 and y-stage guide rail mounts (lower) 228, 232 by the y-stage drive mechanism 236. The head carriage 214, the head carriage guide rail 216 and the head carriage drive mechanism 222 move along with the y-stage blocks 218, 220. Typically, the y-stage drive mechanism 236 drives the y-stage blocks 218, 220 (and, by extension, the head carriage 214) in the y-direction with sufficient precision using a servo controlled stepper motor/belt arrangement (not shown). One skilled in the art will appreciate, however, that any suitable conventional drive mechanism may be used, such as a servo controlled stepper motor/lead screw arrangement.

The z-axis drive mechanism 212, which is conventional, includes the print bed 202 and a print bed drive mechanism 238. Preferably, the print bed 202 includes one or more clamps (not shown) to secure the substrate 204 to the print bed 202. Typically, the print bed drive mechanism 238 drives the print bed 202 in the z-direction with sufficient precision using a servo controlled stepper motor/belt arrangement (not shown). One skilled in the art will appreciate, however, that any suitable conventional drive mechanism may be used, such as a servo controlled stepper motor/lead screw arrangement.

The particular configuration of the inkjet heads 206, 208 illustrated in FIG. 2 is exemplary and for purposes of illustrating embodiments of the present invention and, hence, the particular configuration illustrated therein is not limiting. For example, in the embodiment illustrated in FIG. 2, the inkjet heads 206, 208 are moved together by the x-y plane drive mechanism 210. In alternative embodiment, the inkjet heads 206, 208 may be moved independently of each other by an alternative x-y plane drive mechanism.

The particular configuration of each drive mechanism 210, 212 illustrated in FIG. 2 is exemplary and for purposes of illustrating embodiments of the present invention and, hence, the particular configuration illustrated therein is not limiting. For example, in the embodiment illustrated in FIG. 2, the x-y plane drive mechanism 210 moves the head carriage 214 in the y-direction. In an alternative embodiment, the x-y plane drive mechanism may move the print bed 202 in the y-direction or may turn a print roller (not shown). This latter alternative embodiment requires that the substrate 204 is sufficiently flexible for routing over the print roller in a manner analogous to paper routed over a print roller in a conventional inkjet printer. Also, in the embodiment illustrated in FIG. 2, the z-axis drive mechanism 212 moves the print bed 202 in the z-direction. In an alternative embodiment, the z-axis drive mechanism may move the head carriage 214 in the z-direction.

Preferably, each of the inkjet heads 206, 208 is integrated into a modified version of a conventional inkjet cartridge (not shown). A conventional inkjet cartridge typically integrates an inkjet head, electronics associated with the inkjet head, and contact pads for electrically connecting the inkjet cartridge to the inkjet printing unit. In addition, a conventional inkjet cartridge typically incorporates a reservoir containing ink. In accordance with some embodiments of the present invention, a suitable material for forming the one or more microfluidic channels or the surrounding structure is provided in the reservoir in lieu of ink. Preferably, each inkjet cartridge is mounted to the head carriage 214 in a removable fashion and the head carriage 214 includes contact pads (not shown) for mating with corresponding contact pads of each inkjet cartridge.

In accordance with some embodiments of the present invention, the inkjet head 206 deposits a mixture of one or more hydrophobic polymers (e.g., poly(tetrahydropyranyl-methacrylate) also known as "PTHPMA", poly(methyl methacrylate) also known as "PMMA", polystyrene, polyisobutylene, and/or any other suitable conventional hydrophobic polymer(s) known to those skilled in the art) and one or more suitable cross-linking agents (e.g., triallyl isocyanurate also known as "TAIC" or any other suitable conventional cross-linking agent known to those skilled in the art) in a stream of droplets each having a volume of approximately 500-2000 femtoliters on the surface of the substrate 204. Also, in accordance with some embodiments of the present invention, the inkjet head 208 deposits a mixture of one or more hydrophobic polymers containing a hydrolyzable group (e.g., PTHPMA, PMMA, and/or any other suitable conventional hydrophobic polymer(s) known to those skilled in the art which hydrolyzes to form a hydrophilic material), one or more suitable cross-linking agents (e.g., triallyl isocyanurate also known as "TAIC" or any other suitable conventional cross-linking agent known to those skilled in the art), and one or more photoacid generators (e.g., triphenylsulfonium hexafluorotriflate, (4-octyloxyphenyl)phenyliodonium hexafluoroantimonate, and/or any other suitable conventional photoacid generator(s) known to those skilled in the art) in a stream of droplets each having a volume of approximately 500-2000 femtoliters on the surface of the substrate 204. The mixture deposited by the inkjet head 208 corresponds to the thermally cross-linkable photo-hydrolyzable inkjet printable polymer 112 of FIG. 1. The patterns in which the inkjet heads 206, 208 deposit their respective droplets, layer-by-layer, to form the one or more microfluidic channels and the surrounding structure, are discussed below with reference to FIGS. 3 and 4.

In general, the hydrophobic polymer in the mixture deposited by the inkjet head 206 may be the same or different than the hydrophobic polymer in the mixture deposited by the inkjet head 208. The hydrophobic polymer in the mixture deposited by the inkjet head 208 must contain a hydrolyzable group (i.e., the hydrophobic polymer in this mixture is subsequently hydrolyzed when UV radiation from flood exposure of the entire substrate releases acid from the PAG in this mixture which hydrolyzes the hydrophobic polymer in this mixture to form a hydrophilic material that defines the microfluidic channels). However, the hydrophobic polymer in the mixture deposited by the inkjet head 206 need not contain a hydrolyzable group (i.e., the hydrophobic polymer in this mixture is maintained as a hydrophobic material that defines the polymer matrix surrounding the microfluidic channels).

The cross-linking agent in the mixture deposited by the inkjet head 206 and the cross-linking agent in the mixture deposited by the inkjet head 208 form covalent cross-links between the polymer matrix and the discrete channels printed to form the microfluidic channels. By crosslinking these two polymer phases, phase separation is avoided and well defined microfluidic channels are maintained. In general, the cross-linking agent in the mixture deposited by the inkjet head 206 may be the same or different than the cross-linking agent in the mixture deposited by the inkjet head 208. Suitable cross-linking agents are multi-functional thermally cross-linkable monomers that copolymerize with both the hydrophobic polymer in the mixture deposited by the inkjet head 206 and the hydrophobic polymer in the mixture deposited by the inkjet head 208 to form covalent cross-links between the hydrophobic polymer in the mixture deposited by the inkjet head 206 and the hydrophobic polymer deposited between the inkjet head 208 when subjected to heat. That is, the covalent cross-links extend across the interface between these mixtures. Suitable cross-linking agents include, but are not limited to, TAIC, diallyl itaconate, allyl methacrylate, allyl pentaerythritol, N,N'-methylenebis(acrylamide), trimethylolpropane trimethacrylate, 1,3-butylenegylycol dimethacrylate, polyethyleneglycol diacrylate, polyethyleneglycol dimethacrylate, ethyleneglycol dimethacrylate, diethyleneglycol divinyl ether, tetraethyleneglycol diacrylate, and the like. In addition, a thermal initiator may be used to facilitate curing of the monomers listed above. Suitable thermal initiators include, but are not limited to, AIBN, BPO and other free radical thermal initiators.

In accordance with some embodiments of the present invention, the mixture deposited by the inkjet head 206 typically contains <10 wt % of TAIC (and/or one or more other cross-linking agents). The remainder of the mixture preferably consists of PTHPMA (and/or one or more other hydrophobic polymers). Preferably, the mixture deposited by the inkjet head 206 contains 0.01 to 5 wt % of TAIC (and/or one or more other cross-linking agents). More preferably, the mixture deposited by the inkjet head 206 contains 2 to 5 wt % of TAIC (and/or one or more other cross-linking agents).

In accordance with some embodiments of the present invention, the mixture deposited by the inkjet head 208 typically contains <2 wt % of photoacid generator (PAG). The remainder of the mixture preferably consists of PTHPMA (and/or one or more other hydrophobic polymers which hydrolyze to form hydrophilic materials) and TAIC (and/or one or more other cross-linking agents). Preferably, the mixture deposited by the inkjet head 208 contains 0.01 to 5 wt % of photoacid generator (PAG). More preferably, the mixture deposited by the inkjet head 208 contains 0.1 to 5 wt % of photoacid generator (PAG). Most preferably, the mixture deposited by the inkjet head 208 contains 0.2 to 1 wt % of photoacid generator (PAG).

Also, in accordance with some embodiments of the present invention, the mixture deposited by the inkjet head 208 typically contains <10 wt % of TAIC (and/or one or more other cross-linking agents). The remainder of the mixture preferably consists of PTHPMA (and/or one or more other hydrophobic polymers which hydrolyze to form hydrophilic materials) and PAG. Preferably, the mixture deposited by the inkjet head 208 contains 0.01 to 5 wt % of TAIC (and/or one or more other cross-linking agents). More preferably, the mixture deposited by the inkjet head 208 contains 2 to 5 wt % of TAIC (and/or one or more other cross-linking agents).

As mentioned above, in accordance with some embodiments of the present invention each droplet has a volume of approximately 500-2000 femtoliters. An example of a suitable inkjet head is the Multi-layer Actuator Head (MACH), commercially available from Seiko Epson Corporation, Nagano, Japan. As described in an article to Ozawa et al., "Development of a Femtoliter Piezo Ink-jet Head for high resolution printing", Society for Imaging Science and Technology, NIP23 and Digital Fabrication 2007, Final Program and Proceedings, pages 898-901, the MACH inkjet head is capable of producing droplets as small as 1.5 picoliters. (1 picoliters=1000 femtoliters). The Ozawa et al. article, which also describes an inkjet head capable of producing droplets as small as 400-500 femtoliters, is hereby incorporated herein by reference in its entirety. Generally, droplet volumes at the lower end of the approximately 500-2000 femtoliters range are more preferred. A droplet volume of approximately 500 femtoliters is most preferred.

As reported in the Ozawa et al. article, a 500 femtoliter droplet corresponds to a 10 μm droplet diameter and a 20 μm dot diameter. That is, a droplet that has a diameter of 10 μm in flight produces, after landing on the substrate, a dot approximately twice that size (actually, the dot diameter varies somewhat depending on a number of factors such as surface wetting).

Preferably, the 3D inkjet printing unit 200 includes a heat source 239, which (as further discussed below with reference to FIG. 4) is capable of heating the substrate 204 so that the cross-linking agent in each of the mixtures deposited by the inkjet heads 206, 208 copolymerizes with the hydrophobic polymer in each of these mixtures. For example, the heat source 239 may be a resistive coil heating element lying atop or embedded within the print bed 202.

Preferably, the 3D inkjet printing unit 200 also includes a UV light source 240, which (as further discussed below with reference to FIG. 4) is capable of exposing the substrate 204 and rendering a hydrophobic polymer hydrophilic. For example, ultraviolet light from the light source 240 may be used to convert hydrophobic PTHPMA (i.e., droplets of a mixture deposited on the substrate 204 by the inkjet head 208 containing the hydrophobic PTHPMA, a cross-linking agent, and a photoacid generator) to hydrophilic PMAA.

Figure 3:
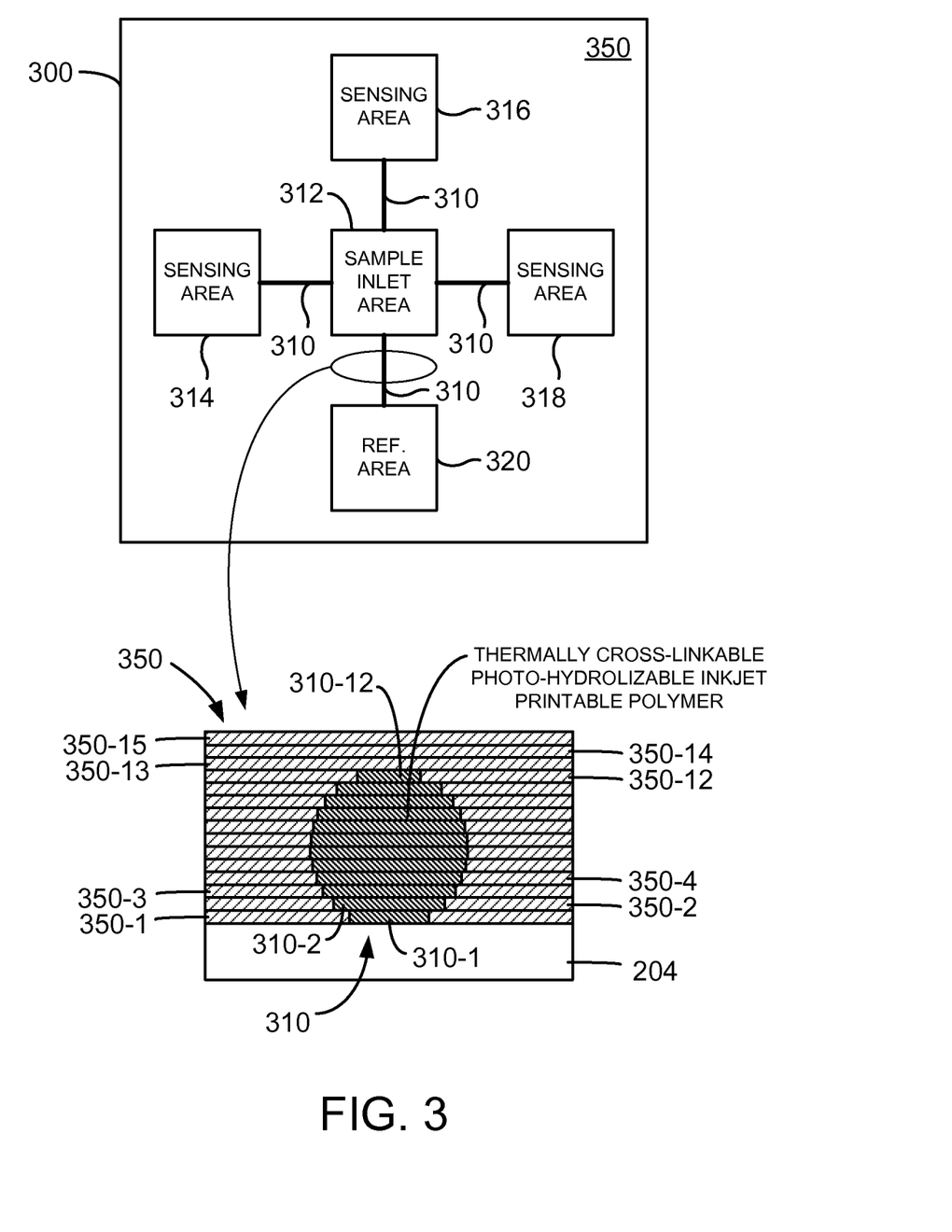
FIG. 3 includes a block diagram illustrating an exemplary application for microfluidic channels fabricated layer-by-layer in a substrate body in accordance with some embodiments of the present invention, wherein the microfluidic channels connect a sample inlet area to a plurality of sensing areas and a reference area.

FIG. 3 includes a block diagram illustrating an exemplary application for microfluidic channels fabricated layer-by-layer in a substrate body 300 in accordance with some embodiments of the present invention, wherein a plurality of microfluidic channels 310 connect a sample inlet area 312 to a plurality of sensing areas 314, 316, 318 and a reference area 320.

The particular microfluidic channel application illustrated in FIG. 3 is exemplary and for purposes of illustrating some embodiments of the present invention and, hence, the particular microfluidic channel application illustrated therein is not limiting. The particular microfluidic channel application illustrated in FIG. 3 is based on an article to Abe et al., "Inkjet-Printed Microfluidic Multianalyte Chemical Sensing Paper", Analytical Chemistry, Vol. 80, No. 18, 2008, pages 6928-6934, published on Web Aug. 13, 2008, which is hereby incorporated herein by reference in its entirety. The three-dimensional hydrophilic microfluidic patterns (550 µm-wide flow channels) disclosed in this article are created by inkjet etching and are open at the top and, therefore, are prone to leak if overturned or suffer contamination through interaction with the environment. In accordance with some embodiments of the present invention, the one or more microfluidic channels fabricated in the substrate body are surrounded by hydrophobic material and, therefore, are much less likely to leak or become contaminated.

In the particular microfluidic channel application illustrated in FIG. 3, the sensing areas 314, 316 and 318 contain "chemical sensing inks" that allow for the simultaneous determination of pH (pH-responsive ink), total protein (protein-sensitive ink), and glucose (glucose-sensitive ink) for urine analysis. The "chemical sensing inks" include suitable conventional chemical reagents for colorimetric analytic assay. During use, a urine sample is initially placed into the sample inlet area 312. From the sample inlet area 312, the urine sample flows through the microfluidic channels 310 via capillary action to the sensing areas 314, 316 and 318 and the reference area 320.

FIG. 3 also includes a sectional diagram illustrating a cross-section of one of the microfluidic channels 310 fabricated layer-by-layer in the substrate body 300 in accordance with some embodiments of the present invention. The microfluidic channel 310 and a surrounding structure 350 are fabricated layer-upon-layer starting with a first layer comprising a first mixture (e.g., PTHPMA and TAIC) in region 350-1 and a second mixture (e.g., PTHPMA, TAIC, and a photoacid generator) in region 310-1 deposited by the inkjet heads as a stream of droplets on the substrate 204 in patterns according to a first cross-sectional slice computed by the 3D printing software. The first mixture corresponds to the mixture deposited by the inkjet head 206 of FIG. 2, and the second mixture corresponds to mixture deposited by the inkjet head 208 of FIG. 2. The second mixture also corresponds to the thermally cross-linkable photo-hydrolyzable inkjet printable polymer 112 of FIG. 1. Next, a second layer comprising the first mixture in region 350-2 and the second mixture in region 310-2 is deposited by the inkjet heads as a stream of droplets on the first layer in patterns according to a second cross-sectional slice computed by the 3D printing software. The process is repeated layer-upon-layer. The twelfth layer is the last to contain the second mixture in region 310-12. The thirteenth, fourteenth, and fifteenth layers contain only the first mixture in regions 350-13, 350-14, and 350-15. The substrate body 300 is heated so that the cross-linking agent in each of the mixtures copolymerizes with the hydrophobic polymer in each of the mixtures. In other words, the cross-linking agent in each of the mixtures forms covalent cross-links between the microfluidic channels 310 and the surrounding structure 350. The microfluidic channel 310 is developed by flood exposure of the substrate body 300 to UV light, which releases acid from the photoacid generator in the second mixture deposited in regions 310-1 through 310-12, which hydrolyzes PTHPMA to form PMMA, thereby rendering the hydrophobic PTHPMA within these regions hydrophilic. The surface of the substrate 204 is preferably hydrophobic so that the microfluidic channel 310 is surrounded by hydrophobic material (i.e., the microfluidic channel 310 is enclosed by surrounding structure 350 and the substrate 204) to minimize leaks and contamination.

By crosslinking the two polymer phases (i.e., hydrophilic microfluidic channel 310 and hydrophobic surrounding structure 350), phase separation is avoided and well defined microfluidic channels 310 are maintained.

In the embodiment illustrated in FIG. 3, hydrophilic channels are created in a hydrophobic matrix. One skilled in the art will appreciate, however, that the opposite is possible in accordance with the present invention to create hydrophobic channels in a hydrophilic matrix.

Preferably, the thickness (i.e., in z-direction) of each 2D layer (e.g. the first layer comprising hydrophobic material in region 350-1 and hydrophilic material in region 310-1) is approximately 10 nm to several hundred microns, and the thickness (i.e., in z-direction) of the resulting 3D structure (e.g., the substrate body) would vary depending on the number and the size of the microfluidic channels being created. The resulting 3D structure could be anywhere from several hundred nanometers to virtually any size.

The inkjet heads may deposit the droplets using a single piezopulse or multiple piezopulses per dot produced. This parameter may be used in controlling the thickness of each 2D layer, along with the droplet volume. The droplets at the lower end of the approximately 500-2000 femtoliters range require an extremely small dot pitch (distance between dots) to bridge the space between the dots.

The particular configuration of the microfluidic channel 310 illustrated in FIG. 3 is exemplary and for purposes of illustrating some embodiments of the present invention and, hence, the particular configuration illustrated therein is not limiting. For example, the cross-sectional profile of the microfluidic channel may be a shape other than circular, such as square or rectangular. Also, a plurality of microfluidic channels may be stacked (i.e., one atop another).

Additional inkjet heads may print the "chemical sensing inks" of the sensing areas 314, 316 and 318 and the reference area 320. Like the microfluidic channels 310, these areas may be surrounded by hydrophobic material to minimize leaks and contamination. Similarly, the sample inlet area 312 may be prepared using still another inkjet head.

As will be appreciated by one skilled in the art, aspects of the present invention may be embodied as a composition, apparatus, method or computer program product. Accordingly, aspects of the present invention may take the form of an entirely hardware embodiment, an entirely software embodiment (including firmware, resident software, microcode, etc.), or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM) (e.g., memory 124 in FIG. 1), a read-only memory (ROM), an erasable programmable read-only memory (EPROM or Flash memory), an optical fiber, a portable compact disc read-only memory (CD-ROM) (e.g., CD-ROM 150 in FIG. 1), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer (e.g., processor 122 of computer system 120 in FIG. 1), special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowcharts and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowcharts and/or block diagram block or blocks.

Figure 4:
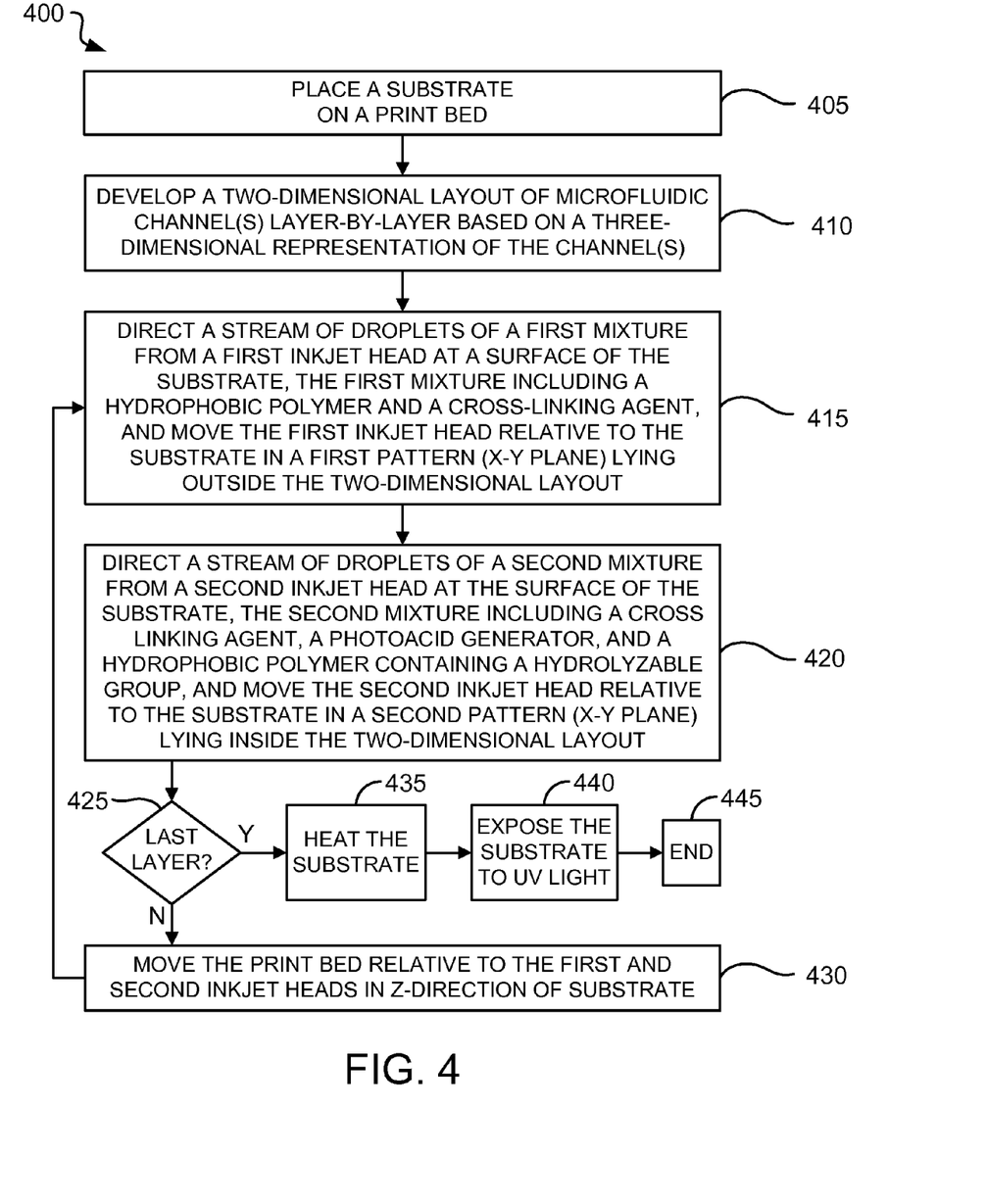
FIG. 4 is a flow diagram illustrating a method of fabricating one or more microfluidic channels in a substrate body using a thermally cross-linkable photo-hydrolyzable inkjet printable polymer in accordance with some embodiments of the present invention.

FIG. 4 is a flow diagram illustrating a method 400 of fabricating one or more microfluidic channels in a substrate body in accordance with some embodiments of the present invention. In the method 400, a first inkjet head prints a first mixture of a hydrophobic polymer and a cross-linking agent, and a second inkjet head prints a mixture of a cross-linking agent, a photoacid generator and a hydrophobic polymer that is rendered hydrophilic upon exposure to UV light.

In the method 400, the steps discussed below (steps 405-440) are performed. These steps are set forth in their preferred order. It must be understood, however, that the various steps may occur at different times relative to one another than shown, or may occur simultaneously. Moreover, those skilled in the art will appreciate that one or more of the steps may be omitted.

The method 400 begins by placing the substrate on the print bed (step 405). The step 405 may be performed manually by a human or automatically by the 3D printing software, for example.

Also, the method 400 continues with the 3D printing software developing a two-dimensional layout (i.e., a cross-sectional slice) of the one or more microfluidic channels layer-by-layer based on a three-dimensional representation of the one or more microfluidic channels (step 410). During the step 410, the 3D printing software may import the microfluidic channel data file (e.g., 3D CAD file) and slice the three-dimensional representation of the one or more microfluidic channels and surrounding structure into thin cross-sectional slices. These cross-sectional slices may then be sent to the 3D inkjet printing unit.

Generally, the steps 405 and 410 may be performed simultaneously or their order reversed.

Next, the method 400 continues with the first inkjet head directing a stream of droplets of a first mixture a hydrophobic polymer and a cross-linking agent at the surface of the substrate as the first inkjet head is moved relative to the substrate in the x-y plane of the substrate (step 415). During the step 415, the first mixture is deposited on the surface of the substrate in a pattern lying outside the two-dimensional layout of the one or more microfluidic channels.

Also, the method 400 continues with the second inkjet head directing a stream of droplets of a mixture of PTHPMA (or another hydrophobic polymer which hydrolyzes to form a hydrophilic material), a cross-linking agent, and a photoacid generator at the surface of the substrate as the second inkjet head is moved relative to the substrate in the x-y plane of the substrate in a pattern lying inside the two-dimensional layout of the one or more microfluidic channels (step 420).

Generally, the steps 415 and 420 may be performed simultaneously (if the inkjet heads move independently) or their order reversed.

Next, the method 400 continues with the determination of whether the layer just printed is the last layer (step 425). The determination of step 425 may be made in the 3D printing unit based on the cross-sectional slices received from the 3D printing software. Alternatively, the determination may be made by the 3D printing software, itself.

If it is determined in the step 425 that the layer just printed is not the last layer, the print bed is moved relative to the inkjet heads in the z-direction of the substrate (step 430). During the step 430, the print bed may be moved away from the inkjets heads in the z-direction by a distance corresponding to the deposit depth of the layer just deposited. Then, the method loops back to the step 415 to print the next layer.

If, on the other hand, it is determined in the step 425 that the layer just printed is the last layer, then the substrate is heated so that the cross-linking agent in each of the mixtures copolymerizes with the hydrophobic polymer in each of the mixtures (step 435). Activation of the heat source in the step 435 may be invoked by either the 3D printing unit or by the 3D printing software. Alternatively, the heat source may be activated manually by a human. The heat source will heat the substrate to a suitable temperature for a suitable period of time sufficient to accomplish the cross-linking. Typically, the heat source will heat the substrate to 60 to 90 C for 1 to 15 minutes.

Next, the substrate is exposed to UV light to render the hydrophobic PTHPMA hydrophilic (step 440). Activation of the UV light source in the step 440 may be invoked by either the 3D printing unit or by the 3D printing software. Alternatively, the UV light source may be activated manually by a human. Typically, the UV light will penetrate all of the layers to a sufficient extent to convert the entirety of the hydrophobic polymer. However, it may be desirable in some cases (e.g., if the total depth of the layers is large) to intermittently expose the substrate before all of the layers are deposited.

After the step 440 is completed, the method ends (step 445).

The flowcharts and block diagrams in the Figures illustrate the architecture, functionality, and operation of possible implementations of compositions, apparatus, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Embodiments herein may also be delivered as part of a service engagement with a client corporation, nonprofit organization, government entity, internal organizational structure, or the like. These embodiments may include configuring a computer system to perform some or all of the methods described herein, and deploying software, hardware, and web services that implement some or all of the methods described herein.

One skilled in the art will appreciate that many variations are possible within the scope of the present invention. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. A composition contained in a reservoir of an inkjet cartridge for fabricating microfluidic channels, consisting of:
   a second mixture in the reservoir of the inkjet cartridge for supply to a second inkjet head, the second mixture consisting of poly(tetrahydropyranyl methacrylate) (PTHPMA), a cross-linking agent, and a photoacid generator, wherein the second mixture contains less than 2 wt % of the photoacid generator and 2 to 5 wt % of the cross-linking agent;
   wherein the cross-linking agent includes a multi-functional thermally cross-linkable monomer that is capable of copolymerizing with both a hydrophobic polymer contained in a first mixture and the PTHPMA to form covalent cross-links between the hydrophobic polymer and the PTHPMA when the first mixture and the second mixture are placed in contact with one another upon being deposited on a substrate by a first inkjet head and the second inkjet head, respectively, and exposed to heat.

2. The composition as recited in claim 1, wherein the cross-linking agent is triallyl isocyanurate (TAIC), and wherein the hydrophobic polymer is selected from a group consisting of poly(tetrahydropyranyl methacrylate) (PTHPMA), poly(methyl methacrylate) (PMMA), and combinations thereof.

3. The composition as recited in claim 1, wherein the cross-linking agent is selected from a group consisting of triallyl isocyanurate (TAIC), diallyl itaconate, allyl methacrylate, allyl pentaerythritol, N,N'-methylenebis(acrylamide), trimethylolpropane trimethacrylate, 1,3-butylenegylycol dimethacrylate, polyethyleneglycol diacrylate, polyethyleneglycol dimethacrylate, ethyleneglycol dimethacrylate, diethyleneglycol divinyl ether, tetraethyleneglycol diacrylate, and combinations thereof, and wherein the hydrophobic polymer is selected from a group consisting of polystyrene, polyisobutylene, and combinations thereof.

4. A composition contained in a reservoir of an inkjet cartridge for fabricating microfluidic channels, consisting of:
   a second mixture in the reservoir of the inkjet cartridge for supply to a second inkjet head, the second mixture consisting of at least one hydrophobic polymer, at least one cross-linking agent, and at least one photoacid generator, wherein the second mixture contains less than 2 wt % of the at least one photoacid generator and 2 to 5 wt % of the at least one cross-linking agent, and wherein each of the at least one hydrophobic polymer contains a hydrolyzable group and is capable of hydrolyzing to form a hydrophilic material when exposed to UV light;

wherein each of the at least one cross-linking agent includes a multi-functional thermally cross-linkable monomer that is capable of copolymerizing with a hydrophobic polymer contained in a first mixture and the at least one hydrophobic polymer to form covalent cross-links between the hydrophobic polymer and the at least one hydrophobic polymer when the first mixture and the second mixture are placed in contact with one another upon being deposited on a substrate by a first inkjet head and the second inkjet head, respectively, and exposed to heat.

5. The composition as recited in claim 4, wherein the at least one hydrophobic polymer is selected from a group consisting of poly(tetrahydropyranyl methacrylate) (PTHPMA), poly(methyl methacrylate) (PMMA), and combinations thereof.

6. The composition as recited in claim 5, wherein the at least one cross-linking agent is selected from a group consisting of triallyl isocyanurate (TAIC), diallyl itaconate, allyl methacrylate, allyl pentaerythritol, N,N'-methylenebis(acrylamide), trimethylolpropane trimethacrylate, 1,3-butylenegylycol dimethacrylate, polyethyleneglycol diacrylate, polyethyleneglycol dimethacrylate, ethyleneglycol dimethacrylate, diethyleneglycol divinyl ether, tetraethyleneglycol diacrylate, and combinations thereof.

7. The composition as recited in claim 5, wherein the at least one photoacid generator is selected from a group consisting of triphenylsulfonium hexafluorotriflate, (4-octyloxy-phenyl) phenyliodonium hexafluoroantimonate, and combinations thereof.

8. A composition, consisting of:
a mixture consisting of at least one hydrophobic polymer, at least one cross-linking agent, and at least one photoacid generator, wherein the mixture contains less than 2 wt % of the at least one photoacid generator and 2 to 5 wt % of the at least one cross-linking agent,
wherein the at least one hydrophobic polymer is selected from a group consisting of poly(tetrahydropyranyl methacrylate) (PTHPMA), poly(methyl methacrylate) (PMMA), and combinations thereof,
wherein the at least one cross-linking agent is selected from a group consisting of triallyl isocyanurate (TAIC), diallyl itaconate, allyl methacrylate, allyl pentaerythritol, N,N'-methylenebis(acrylamide), trimethylolpropane trimethacrylate, 1,3-butylenegylycol dimethacrylate, polyethyleneglycol diacrylate, polyethyleneglycol dimethacrylate, ethyleneglycol dimethacrylate, diethyleneglycol divinyl ether, tetraethyleneglycol diacrylate, and combinations thereof, and
wherein the at least one photoacid generator is selected from a group consisting of triphenylsulfonium hexafluorotriflate, (4-octyloxy-phenyl) phenyliodonium hexafluoroantimonate, and combinations thereof.

* * * * *